(12) United States Patent
He et al.

(10) Patent No.: US 11,619,682 B2
(45) Date of Patent: Apr. 4, 2023

(54) TRANSFORMER FAILURE IDENTIFICATION AND LOCATION DIAGNOSIS METHOD BASED ON MULTI-STAGE TRANSFER LEARNING

(71) Applicant: WUHAN UNIVERSITY, Hubei (CN)

(72) Inventors: Yigang He, Hubei (CN); Jiajun Duan, Hubei (CN); Xiaoxin Wu, Hubei (CN); Liulu He, Hubei (CN); Hui Zhang, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 119 days.

(21) Appl. No.: 17/105,616

(22) Filed: Nov. 26, 2020

(65) Prior Publication Data

US 2021/0190882 A1  Jun. 24, 2021

(30) Foreign Application Priority Data

Dec. 10, 2019  (CN) .......................... 201911261469.X (51) Int. Cl.
| | |
|---|---|
| *G01R 31/62* | (2020.01) |
| *G06N 3/04* | (2006.01) |
| *G06N 3/08* | (2006.01) |
| *G01R 31/00* | (2006.01) |

(52) U.S. Cl.
CPC ............ *G01R 31/62* (2020.01); *G01R 31/00* (2013.01); *G06N 3/0454* (2013.01); *G06N 3/08* (2013.01)

(58) Field of Classification Search
CPC ...... G01R 31/62; G01R 31/00; G06N 3/0454; G06N 3/08
See application file for complete search history.

(56) References Cited

FOREIGN PATENT DOCUMENTS

| CN | 110516757 A | * 11/2019 |
|---|---|---|
| KR | 101581018 B1 | * 12/2015 |

OTHER PUBLICATIONS

Bai J. and et al, "The transformer winding deformation based on finite element method and regular limit learning machine", 2018 Eighth International Conference on Instrumentation & Measurement, Computer, Communication and Control (IMCCC) (Year: 2018).*

(Continued)

*Primary Examiner* — Douglas Kay
(74) *Attorney, Agent, or Firm* — JCIPRNET (57) ABSTRACT

A transformer failure identification and location diagnosis method based on a multi-stage transfer learning theory is provided. Simulation is set up first, a winding parameter of a transformer to be tested is calculated, and a winding equivalent circuit is accordingly built. Different failures are configured for the equivalent circuit, and simulation is performed to obtain a large number of sample data sets. A sweep frequency response test is performed on the transformer to be tested, and detection data sets are obtained. Initial network training is performed on simulation data sets by using the transfer learning method, and the detection data sets are further trained accordingly. A failure support matrix obtained through diagnosis is finally fused. The multi-stage transfer learning theory is provided by the disclosure.

15 Claims, 9 Drawing Sheets

(56) References Cited

OTHER PUBLICATIONS

M. Prameela and et al, "Diagnosis and Identification of Transformer Winding Faults from Frequency Response Data by the Application of ANN Technique", 2012 IEEE 10th International Conference on the Properties and Applications of Dielectric Materials Jul. 24-28, 2012, Bangalore, India (Year: 2012).*

Y. Luo and et al, Recognition Technology of Winding Deformation Based on Principal Components of Transfer Function Characteristics and Artificial Neural Network, IEEE Transactions on Dielectrics and Electrical Insulation vol. 24, No. 6; Dec. 2017 (Year: 2017).*

* cited by examiner

TRANSFORMER FAILURE IDENTIFICATION AND LOCATION DIAGNOSIS METHOD BASED ON MULTI-STAGE TRANSFER LEARNING

CROSS-REFERENCE TO RELATED APPLICATION

This application claims the priority benefit of China application serial no. 201911261469.X, filed on Dec. 10, 2020. The entirety of the above-mentioned patent application is hereby incorporated by reference herein and made a part of this specification.

BACKGROUND

Technical Field

The disclosure relates to a power transformer failure diagnosis method, and in particular, to a failure diagnosis method of transformer winding sweep frequency response test data based on transfer learning and a deep convolutional neural network.

Description of Related Art

Development of power equipment continues to focus on intelligence and high integration. The advancement of failure diagnosis methods and the relevance of equipment becomes increasingly important. Failure diagnosis of key power transmission and distribution equipment such as power transformers ensures safe and economic operation of power systems. Winding failures account for a major proportion of transformer failures. Moreover, frequency response analysis (FRA) is highly sensitive to failure diagnosis, so the in-depth study of its feature extraction method exhibits important practical significance.

Deep learning may be used to achieve automatic identification and rapid processing of abnormal states, which is thereby the development trend of neighborhood failure diagnosis in the future. The deep convolutional neural network (CNN) has a significant advantage in the field of image processing because CNN may be used to extract deep features and process a large amount of unstructured data. Power equipment such as transformers, on the other hand, exhibits high reliability. Defects or failures are small probability events, and data on equipment abnormalities is scarce. Deep learning methods of CNN and the like require a large amount of training data. The lack of valid abnormal data considerably limits its application in transformer failure diagnosis. Knowledge features may be obtained through transfer learning from existing domains and may then be applied to target domains. The simulation data of power equipment is an important reference that is easy to obtain and provides a large quantity and may play a transitional role in the deep learning training of power equipment.

SUMMARY

The disclosure provides an intelligent failure diagnosis method of multi-stage transfer learning aiming to improve intelligence or accuracy of the failure diagnosis method for power equipment such as a transformer and to address the problem of a small amount of failure data of power equipment and difficulty in deep learning training.

In order to achieve the object of the disclosure, technical solutions provided by the disclosure includes the following.

A transformer failure identification and location diagnosis method based on multi-stage transfer learning is provided and includes the following steps.

1) A finite element model is established according to a structure and a material property of a transformer to be tested, and a winding parameter thereof is simulated and calculated.

2) A sweep frequency response test is performed on the transformer to be tested, and different failure situations of the transformer are simulated. A plurality of taps are selected to act as detection points of the sweep frequency response test if the taps are present, and detection data sets including information of the detection points are obtained. History detection data of the transformer to be tested is added to the detection data sets if the history detection data is provided.

3) A winding equivalent circuit of the transformer is built, the winding parameter obtained through calculating is inputted into the equivalent circuit, and programming is performed to accomplish a sweep frequency response analysis of the equivalent circuit.

4) A loop is set up in a program, and a large number of simulation data sets are simulated and obtained for the detection points and failure situations in 2).

5) A convolutional neural network of two-stage transfer learning is constructed, each of the simulation data sets and the detection data sets are divided into a training set and a validation set, and data enhancement is performed on all data.

6) Initial network training is performed on the simulation data sets by using a transfer learning method.

7) An one-stage trained network is kept, and multi-stage training is accordingly performed on the detection data sets.

8) The transformer to be tested is diagnosed by using the trained network, and the detection data sets including the information of the detection points is finally fused with a failure support matrix obtained through network diagnosis.

In the foregoing technical feature, the structure of the transformer provided in step 1) includes an axial height, a winding thickness, a winding radial width, an iron core thickness, an iron core outer diameter, a winding inner diameter, an insulation paper outer diameter, an end ring thickness, a pad thickness, and a stay thickness of the transformer to be tested. The material property of the transformer includes relative dielectric constants of insulation paper, a pad, a stay, an end ring, and a phenolic paper tube. Simulating and obtaining the parameter of the transformer are performed for a normal state. Resistance and self-inductance are calculated by using 1 disk in the 3D model. Mutual inductance and capacitance are calculated by using 2 disks. Earth capacity Cg is calculated by using an iron core and one disk of winding. 2nd-order mutual inductance is calculated by using 3 disks of winding, and winding parameters of orders in an approximate equivalent circuit are identical in the equivalent circuit.

Following the above technical solution, the step of simulating different failure situations in step 2) further includes the following. A pad is added between different windings or between a winding and an iron core, and a winding pitch failure and a winding ground failure are simulated. If the taps are presented, the taps are connected to a resistor, a capacitor, or an inductor in parallel to simulate a failure. When the taps are present, the taps are selected to act as the detection points of the sweep frequency response test, and the detection data sets including the information of the detection points are obtained.

Following the above technical solution, the winding equivalent circuit of the transformer in step 3) is an N-order lumped parameter equivalent circuit. Circuit parameters: ground resistance $C_g$, inter-winding capacitance $C_s$, self-inductance $L_s$, mutual inductance $M_{i(i+1)}$, and resistance R calculated and obtained in step 1) are substituted into the equivalent circuit, and the sweep frequency response analysis is accomplished through programming.

Following the above technical solution, the step of obtaining the simulation data sets in step 4) further includes the following. A loop is set up based on a normal state value, and parameters of ground resistance $C_g$, inter-winding capacitance $C_s$, self-inductance $L_s$, mutual inductance $M_{i(i+1)}$, and resistance R of the equivalent circuit provided to be 1-2 times the normal state value are selected according to detection content. Selection of a loop step length and an abnormal parameter is determined according to a required number of the data sets and a failure type needed to be detected.

Following the above technical solution, the step of constructing the convolutional neural network based on multi-stage transfer learning for performing two-stage transfer learning specifically includes the following.

1) The public data sets are marked as $D_1$, the simulation data sets are marked as $D_2$ (acting as the target domain in a first-stage transfer and acting as one source domain in a second-stage transfer), and detection data is marked as $D_3$ (acting as the target domain in the second stage). As such, first-stage transfer learning includes the following:

$$\text{Source:} \begin{cases} D_s = D_1 = \{\chi_1, P_1(X_1)\}; \\ T_s = T_1\{Y_1, f_1(\cdot)\}; \end{cases}$$

$$\text{Target:} \begin{cases} D_T = D_2 = \{\chi_2, P_2(X_2)\}; \\ T_T = T_2\{Y_2, f_2(\cdot)\}; \end{cases}$$

$$X_\xi = \{\chi_{\xi 1}, \chi_{\xi 2}, \ldots, \chi_{\xi n1}\} \in \chi_\xi |_{\xi = 1,2};$$

$$Y_\xi = \{y_{\xi 1}, \ldots, y_{\xi n2}\} |_{\xi = 1,2};$$

where the source domain $D_S$, the learning task $T_S$ on the source domain, the target domain $D_T$, and the learning task $T_T$ on the target domain are provided. Herein, $D_S \neq D_T$ and $T_S \neq T_T$, $\chi$ represents a feature space, $P(X)$ represents a marginal probability distribution, $X = \{x_1, \ldots, x_{n1}\} \in \chi$, $Y$ represents a label space, $Y = \{y_1, \ldots, y_{n2}\}$, n1 represents a feature space size, n2 represents a label space size, n1=n2=n, a prediction function $f(\cdot)$ may not be observed, a domain and a label are required to be learned in pairs, $D_1 \gg D_2$, $D_1$ is not similar to $D_2$, the first-stage transfer learning is transferred from $D_1$ to $D_2$, part of convolutional layers close to an input end of a pre-training model are frozen, and the remaining convolutional layers close to an output end and a full connection layer are trained.

2) A second-stage transfer process includes the following:

$$\text{Source:} \begin{cases} D_s = D_{1 \cup 2} = \{\chi_{1 \cup 2}, P_{1 \cup 2}(X_1, X_2)\}; \\ T_s = T_{1 \cup 2} = \{Y_{1 \cup 2}, f_{1 \cup 2}(\cdot)\}; \end{cases}$$

$$\text{Target:} \begin{cases} D_T = D_3 = \{\chi_3, P_3(X_3)\}; \\ T_T = T_3 = \{Y_3, f_3(\cdot)\}; \end{cases}$$

$$X_\xi = \{\chi_{\xi 1}, \chi_{\xi 2}, \ldots, \chi_{\xi n}\} \in \chi_\xi |_{\xi = 1 \cup 2, 3};$$

$$Y_\xi = \{y_{\xi 1}, \ldots, y_{\xi n}\} |_{\xi = 1 \cup 2, 3};$$

where a subscript $\xi = "1 \cup 2"$ represents a new domain/task/feature space/label space/probability distribution/prediction function after a first transfer, $D_{1 \cup 2} > D_3$, $D_{1 \cup 2} \sim D_3$, second-stage transfer learning is transferred from $D_{1 \cup 2}$ to $D_3$, most of the convolutional layers of a network model obtained through the previous step of transfer are frozen, and the remaining convolutional layers and the full connection layer are trained.

Following the above technical solution, the step of performing data enhancement to expand the data sets in step 5) includes the following categories to be specifically processed: color conversion *6 times, randomly adding noise *5 times, zooming *4 times, flipping *1 times, rotating *3 times, and cropping *5 times.

Following the above technical solution, the steps of dividing each of the simulation data sets and the detection data sets into a test set and the validation set in a network training process in steps 6) to 7) further include the following. Training validation is performed on a first-stage transfer process and a second-stage transfer process sequentially inputted into a two-stage convolutional neural network. A dividing ratio of the test set to the validation set is determined according to actual needs. The test set and the validation set of the simulation data sets are inputted in the first stage, and the test set and the validation set of the detection data sets are inputted in the second stage. Network parameters are progressively updated, and a trained network diagnosis model is finally obtained.

Following the above technical solution, the method of fusing diagnosis information of the detection points in step 8) includes a multi-source information fusion algorithm of evidence theory to synthesize diagnosis results of the detection points.

The disclosure further provides a computer storage media storing the transformer failure identification and location diagnosis method based on two-stage transfer learning provided in the foregoing technical solutions.

To make the aforementioned more comprehensible, several embodiments accompanied with drawings are described in detail as follows.

BRIEF DESCRIPTION OF THE DRAWINGS

The disclosure is further described in detail in combination with accompanying figures and embodiments, and the following figures are provided.

DESCRIPTION OF THE EMBODIMENTS

To better illustrate the goal, technical solutions, and advantages of the disclosure, the following embodiments accompanied with drawings are provided so that the disclosure are further described in detail. It should be understood that the specific embodiments described herein serve to explain the disclosure merely and are not used to limit the disclosure.

The disclosure may not only be applied to a failure diagnosis method of a transformer winding sweep frequency response analysis but may also be extended to other diagnosis fields.

In a transfer learning method provided by the disclosure, progressive relationships provided by features of different data sets are comprehensively considered. Based on a network pre-trained by public data sets, a simulation data set is used for initial network training, and a detection data set is used next to train the network. Regarding a diagnosis situation of a plurality of detection points, failure supports obtained through a diagnosis are fused, and accuracy is enhanced in this way.

Figure 1:
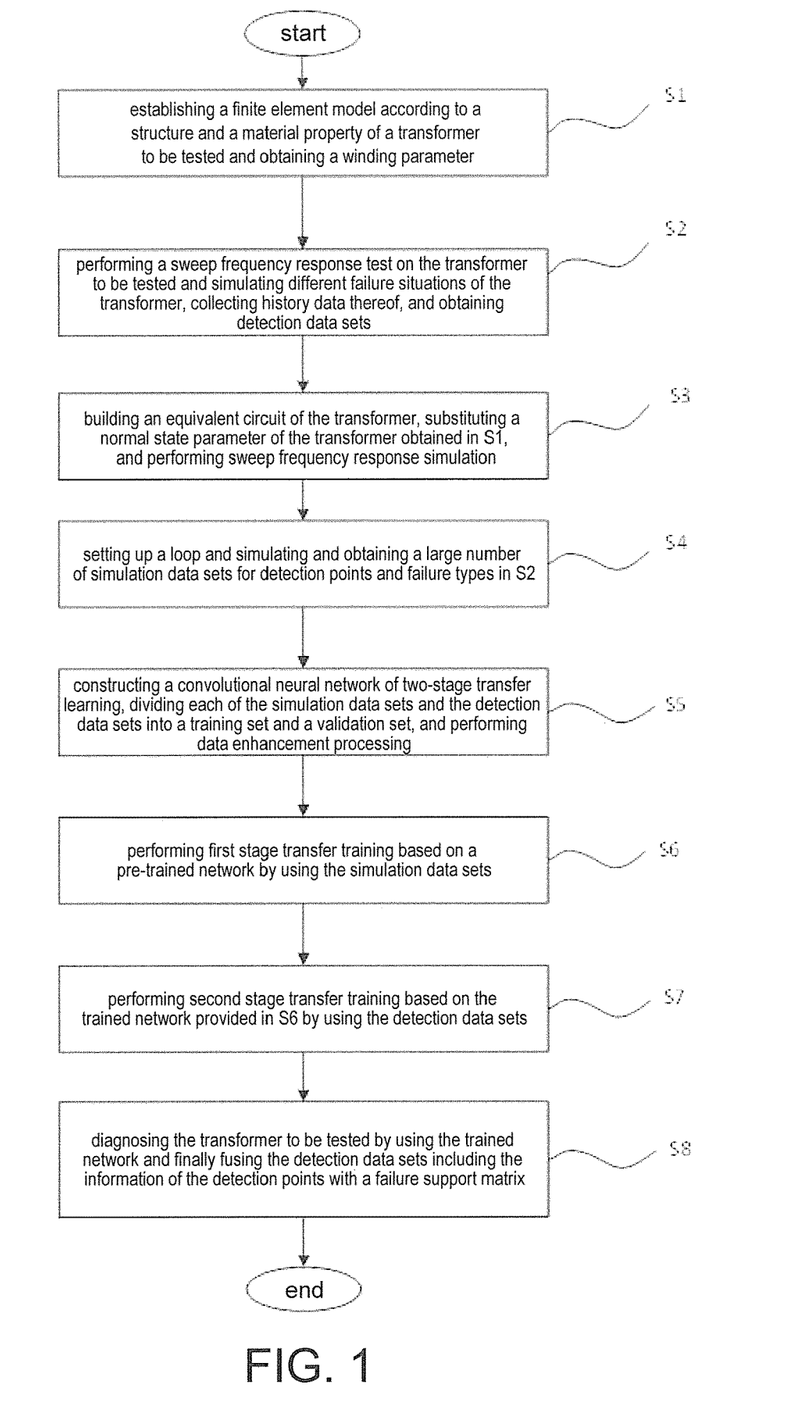
FIG. 1 is a failure diagnosis flow chart performed based on two-stage transfer learning according to the disclosure.

As shown in the flow chart in FIG. 1, a two-stage transfer diagnosis is taken as an example herein. A transformer failure identification and location diagnosis method based on two-stage transfer learning includes the following step.

In S1, a finite element model is established according to a structure and a material property of a transformer to be tested, and a winding parameter thereof is simulated and calculated.

In step S2, a sweep frequency response test is performed on the transformer to be tested, and different failure situations are simulated through a winding connected to a inductor, a capacitor, etc. in parallel. If a plurality of taps are present, a plurality of detection points of the sweep frequency response test are selected, and detection data sets including information of the detection points are obtained. History detection data of such apparatus may be added to the detection data sets if such history detection data is provided.

In step S3, a winding equivalent circuit of the transformer is built, the winding parameter obtained through calculating is inputted into the winding equivalent circuit, and programming is performed to accomplish a sweep frequency response analysis of the winding equivalent circuit.

In step S4, a loop is set up in a program, and a large number of simulation data sets are simulated and obtained for the detection and failure situations provided in step S2.

In step S5, a convolutional neural network of two-stage transfer learning is constructed. Each of the simulation data sets and the detection data sets are divided into a training set and a validation set, and data enhancement is performed on all data.

In step S6, initial network training is performed on the simulation data sets by using a transfer learning method.

In step S7, an one-stage trained network is kept, and second-stage training is accordingly performed on the detection data sets.

In step S8, the transformer to be tested is diagnosed by using the trained network. The detection data sets including the information of the detection points are fused with a failure support matrix obtained through network diagnosis.

Further, the structure of the transformer provided in step S1 includes an axial height, a winding thickness, a winding radial width, an iron core thickness, an iron core outer diameter, a winding inner diameter, an insulation paper outer diameter, an end ring thickness, a pad thickness, a stay thickness, etc. of the transformer to be tested. The material property of the transformer includes relative dielectric constants of insulation paper, a pad, a stay, an end ring, a phenolic paper tube, etc. Simulating and obtaining the parameter of the transformer are performed for a normal state. Resistance and self-inductance are calculated by using 1 disk in a 3D model. Mutual inductance and capacitance are calculated by using 2 disks. Earth capacity Cg is calculated by using an iron core and one disk of winding. $2^{nd}$-order mutual inductance is calculated by using 3 disks of winding, and winding parameters of orders in an approximate equivalent circuit are identical in the equivalent circuit.

Further, the step of simulating different failure situations in step S2 further includes the following. A pad is added between different windings or between a winding and an iron core, and a winding pitch failure and a winding ground failure are simulated. If the taps are presented, the taps are connected to a resistor, a capacitor, or an inductor in parallel to simulate a failure. When the taps are present, the taps may be selected to act as the detection points of the sweep frequency response test, and the detection data sets including the information of the detection points are obtained.

Moreover, the winding equivalent circuit of the transformer provided in step S3 is an N-order lumped parameter equivalent circuit. Circuit parameters: ground resistance $C_g$, inter-winding capacitance $C_s$, self-inductance $L_s$, mutual inductance $M_{i(i+1)}$, resistance R, etc. calculated and obtained in step 1) are substituted into the equivalent circuit, and the sweep frequency response analysis is accomplished through programming.

Moreover, the step of obtaining the simulation data sets in step S4 further includes the following. A loop is set up based on a normal state value, and parameters of $C_g$, $C_s$, $L_s$, $M_{i(i+1)}$, and R of the equivalent circuit provided to be 1-2 times the normal state value are selected according to detection content. Selection of a loop step length and an abnormal parameter is determined according to a required number of the data sets and a failure type needed to be detected.

A principle of a multi-stage transfer learning model provided by the disclosure includes the following.

A source domain $D_S$, a learning task $T_S$ on the source domain, a target domain $D_T$, and a learning task $T_T$ on the target domain are given first. Herein, $D_S \neq D_T$ and $T_S \neq T_T$, and the following is thereby provided:

$$D = \{\chi, P(X)\};$$

$$T = \{Y, f(\cdot)\};$$

where $\chi$ represents a feature space, $P(X)$ represents a marginal probability distribution, $X = \{x_1, \ldots, x_n\} \in \chi$, Y represents a label space, $Y = \{y_1, \ldots, y_1\}$, a prediction function $f(\cdot)$ may not be observed, and a domain and a label are required to be learned in pairs.

In a case of multi-step transfer learning, let the data sets to be $D\xi$, while $\xi$ represents different data sets and $\xi \geq 3$. The following is thereby provided:

$$\begin{cases} D_{s\xi} = \{\chi_\xi, P_\xi(x_\xi)\}; \\ T_\xi = \{Y_\xi, f_\xi(\cdot)\}; \\ \xi = \{1, 2, \ldots \}; \end{cases}$$

where $$X_\xi = \{\chi_{\xi 1}, \chi_{\xi 2}, \ldots, \chi_{\xi n}\} \in \chi_\xi;$$

$$Y_\xi = \{y_{\xi 1}, \ldots, y_{\xi n}\};$$

Further, in the convolutional neural network which is constructed based on the two-stage transfer learning principle provided in step S5, previous layers may extract general features and have a little relationship with a target. Latter layers extract specific features, so that the data sets may be trained based on the parameters of this part of layers. Specific steps are provided as follows.

1) The public data sets are marked as $D_1$, the simulation data sets are marked as $D_2$ (acting as the target domain in a first-stage transfer and acting as one source domain in a second-stage transfer), and detection data is marked as $D_3$ (acting as the target domain in the second stage). As such, first-stage transfer learning includes the following:

$$\text{Source:} \begin{cases} D_s = D_1 = \{\chi_1, P_1(X_1)\}; \\ T_s = T_1\{Y_1, f_1(\cdot)\}; \end{cases}$$

$$\text{Target:} \begin{cases} D_T = D_2 = \{\chi_2, P_2(X_2)\}; \\ T_T = T_2\{Y_2, f_2(\cdot)\}; \end{cases}$$

$$X_\xi = \{\chi_{\xi 1}, \chi_{\xi 2}, \ldots, \chi_{\xi n1}\} \in \chi_\xi |_{\xi=1,2};$$

$$Y_\xi = \{y_{\xi 1}, \ldots, y_{\xi n2}\} |_{\xi=1,2};$$

where the source domain $D_S$, the learning task $T_S$ on the source domain, the target domain $D_T$, and the learning task $T_T$ on the target domain are provided. Herein, $D_S \neq D_T$, $T_S \neq T_T$, $\chi$ represents the feature space, P(X) represents the marginal probability distribution, X={$x_1, \ldots, x_{n1}$}∈$\chi$, Y represents the label space, Y={$y_1, \ldots, y_{n2}$}, n1 represents a feature space size, n2 represents a label space size, n1=n2=n in general, the prediction function f(•) may not be observed, a domain and a label are required to be learned in pairs, $D_1 \gg D_2$, and $D_1$ is not similar to $D_2$. Therefore, the first-stage transfer learning is transferred from $D_1$ to $D_2$, part of convolutional layers (close to an input end) of a pre-training model are frozen, and the remaining convolutional layers (close to an output end) and a full connection layer are trained.

2) A second-stage transfer process includes the following:

$$\text{Source:} \begin{cases} D_s = D_{1 \cup 2} = \{\chi_{1 \cup 2}, P_{1 \cup 2}(X_1, X_2)\}; \\ T_s = T_{1 \cup 2} = \{Y_{1 \cup 2}, f_{1 \cup 2}(\cdot)\}; \end{cases}$$

$$\text{Target:} \begin{cases} D_T = D_3 = \{\chi_3, P_3(X_3)\}; \\ T_T = T_3 = \{Y_3, f_3(\cdot)\}; \end{cases}$$

$$X_\xi = \{\chi_{\xi 1}, \chi_{\xi 2}, \ldots, \chi_{\xi n}\} \in \chi_\xi |_{\xi=1 \cup 2,3};$$

$$Y_\xi = \{y_{\xi 1}, \ldots, y_{\xi n}\} |_{\xi=1 \cup 2,3};$$

where a subscript ξ="1∪2" represents a new domain/task/feature space/label space/probability distribution/prediction function and the like after a first transfer, and $D_{1 \cup 2} > D_3$ and $D_{1 \cup 2} \sim D_3$. Therefore, second-stage transfer learning is transferred from $D_{1 \cup 2}$ to $D_3$, most of the convolutional layers (close to the input end) of a network model obtained through step 1) of transfer are frozen, and the remaining convolutional layers (close to the output end) and the full connection layer are trained.

Further, in step S5, data enhancement may be adopted to expand the data sets, so that overfitting may be prevented in a training process. The following categories are specifically processed: color conversion *6 times (grayscale+5 RGB channels are randomly superimposed), randomly adding noise *5 times, zooming *4 times (0.8, 0.9, 1.1, and 1.2 times), flipping *1 times, rotating *3 times (90°, 180°, and 2700 degrees), and cropping *5 times.

Further, in steps S6 and S7, each of the simulation data sets and the detection data sets are required to be into a test set and the validation set in a network training process, and training validation is performed on a first-stage transfer process and a second-stage transfer process sequentially inputted into a two-stage convolutional neural network. A dividing ratio of the test set to the validation set is determined according to actual needs. The test set and the validation set of the simulation data sets are inputted in the first stage, and the test set and the validation set of the detection data sets are inputted in the second stage. Network parameters are progressively updated, and a trained network diagnosis model is finally obtained.

Moreover, the method of fusing diagnosis information of the detection points in step S8 includes a multi-source information fusion algorithm of evidence theory to synthesize diagnosis results of the detection points, and diagnosis accuracy may thus be significantly improved.

In a preferred embodiment of the disclosure, the specific implementation steps are provided as follows.

Figure 2:
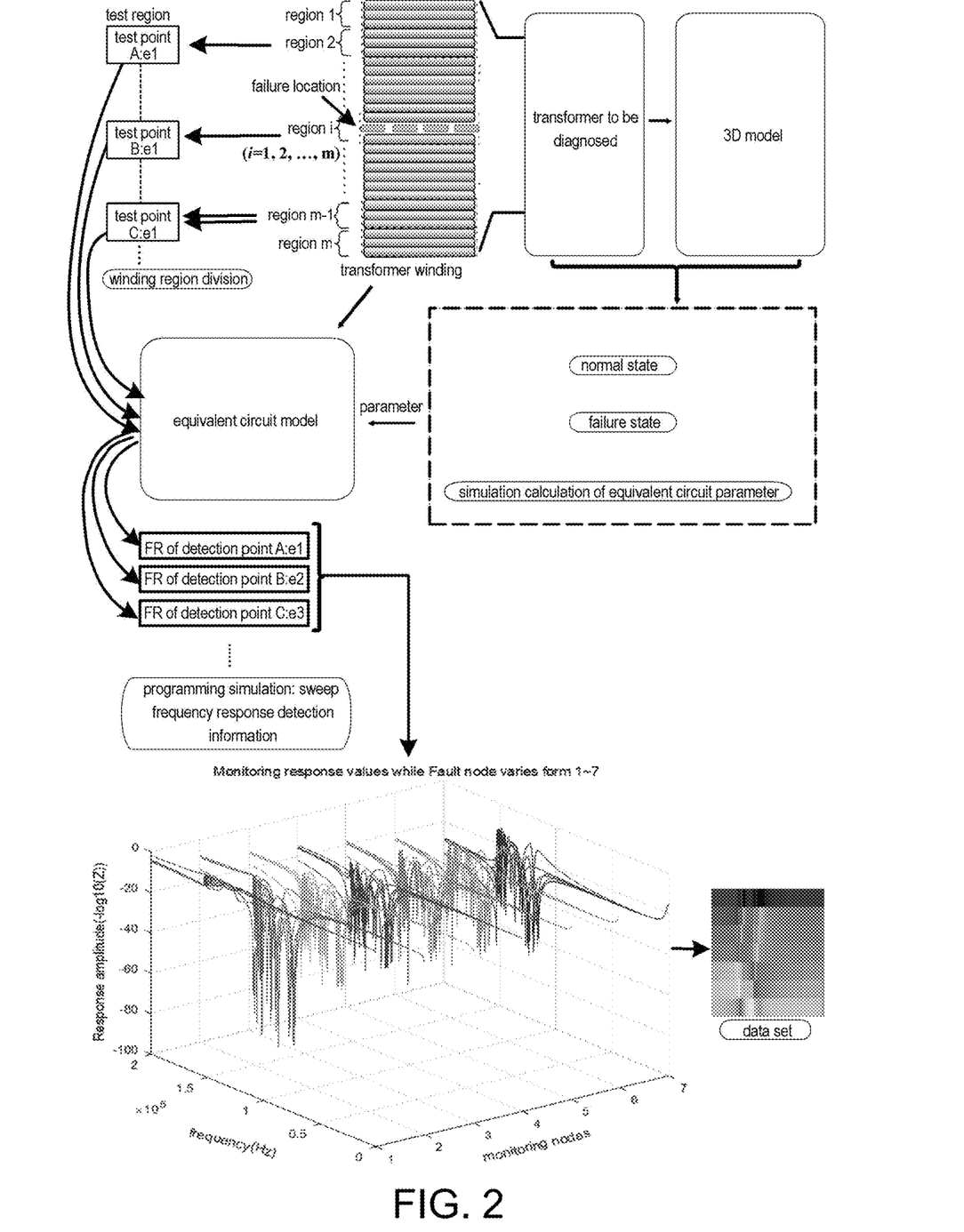
FIG. 2 is a schematic diagram of a method of obtaining simulation data sets according to the disclosure.

A 3D finite element model is built according to a structure parameter and a material property of a transformer to be diagnosed as shown in FIG. 2. Resistance and self-inductance are calculated by using 1 disk in the 3D model. Mutual inductance and capacitance are calculated by using 2 disks. Earth capacity $C_g$ is calculated by using an iron core and one disk of winding. 2nd-order mutual inductance is calculated by using 3 disks of winding (e.g., M13 in the equivalent circuit provided in the figure). A major parameter of the transformer to be diagnosed under a normal state is obtained through simulation.

Figure 3:
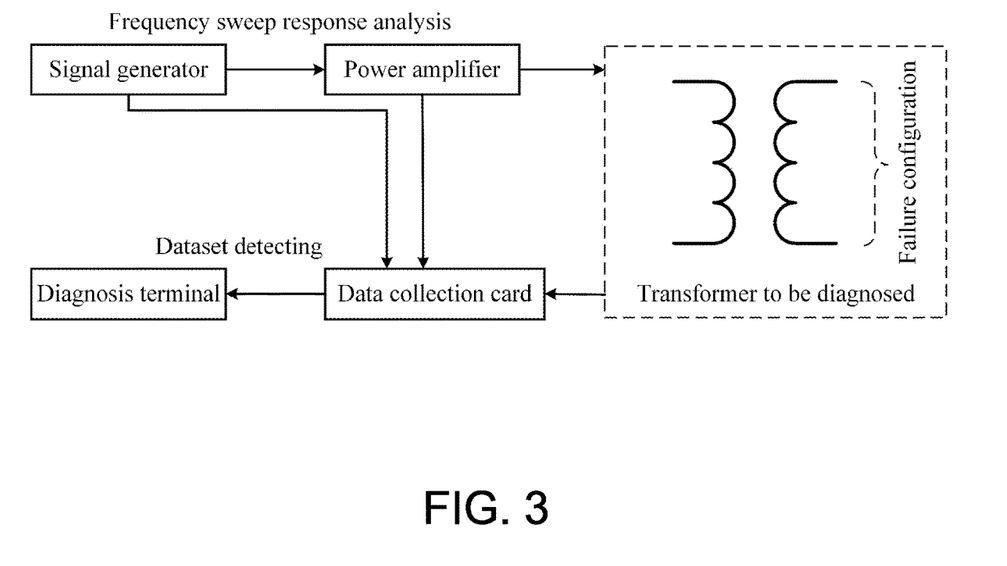
FIG. 3 is a schematic diagram of a method of obtaining detection data sets according to the disclosure.

A sweep frequency response test is performed on the transformer to be tested, and a FRA waveform is recorded. A method thereof is provided in the schematic diagram shown in FIG. 3. Manners such as connecting a winding to an inductor in parallel, connecting a winding to a capacitor in parallel, and adding a pad between windings may be adopted to simulate different failure situations. If it is required to determine whether a failure is present only, labels are configured to be "yes" and "no". If a failure type is required to be determined, a failure position is required to be diagnosed, and so on, a plurality of labels are needed to be configured. For instance, a failure type j and a failure region i may be combined and written as "ji", the corresponding label is Hγ, and the label under the normal state is recorded as "00". That is, $H_\gamma$={00, 11, 12, . . . , ji}, (γ=1, 2, . . . , 1), and 1 is a total number of labels. When plural taps are present, plural detection points of the sweep frequency response test are selected, and test data sets including information of the detection points are obtained. In this embodiment, 3 detection points $e_k$ (detection point k=A, B, and C), 3 failure types j (j=1, 2, and 3), and 7 failure regions i (i=1, 2, . . . , and 7) are configured. Herein, the failure type is j={1 (pitch between disks), 2 (short circuit between disks), and 3 (deformation)}, a dividing manner used to divide the failure region is to evenly divide the transformer winding into 7 portions, and the $1^{st}$ to the $7^{th}$ portions are arranged respectively from an input end and an output end of a sweep signal. Regarding the pitch failure between disks of winding (a winding is wrapped by many turns as a disk, and many disks are combined into a complete coil), a capacitor is connected between two disks of winding in parallel for simulating. Regarding the short circuit failure between disks of winding, a corresponding nut is connected through a wire for simulating. Regarding the winding deformation failure, a capacitor and an inductor may be connected in parallel for simulating. Different failure levels may be configured for every failure type, and the sweep frequency response test is performed on each failure type to obtain the detection data sets.

The winding equivalent circuit of the transformer in step S3 is an N-order lumped parameter equivalent circuit. Circuit parameters: ground resistance $C_g$, inter-winding capacitance $C_s$, self-inductance $L_s$, mutual inductance $M_{i(i+1)}$, and resistance R, etc. calculated and obtained in step 1) are substituted into the equivalent circuit, and the sweep frequency response analysis is accomplished through programming.

After information such as a failure feature and the failure region of the detection data sets is confirmed, a significant amount of simulation is required to be performed to obtain the simulation data sets. An equivalent circuit parameter obtained under the normal state through simulation is substituted into the winding equivalent circuit. A program is written by matlab, and a loop is set for the failure type and failure region simulated by the detection data sets, the sweep frequency response analysis of the equivalent circuit in terms of different failure levels/different failure positions/different failure types is accomplished, and the simulation data sets are thereby obtained.

Figure 5A:
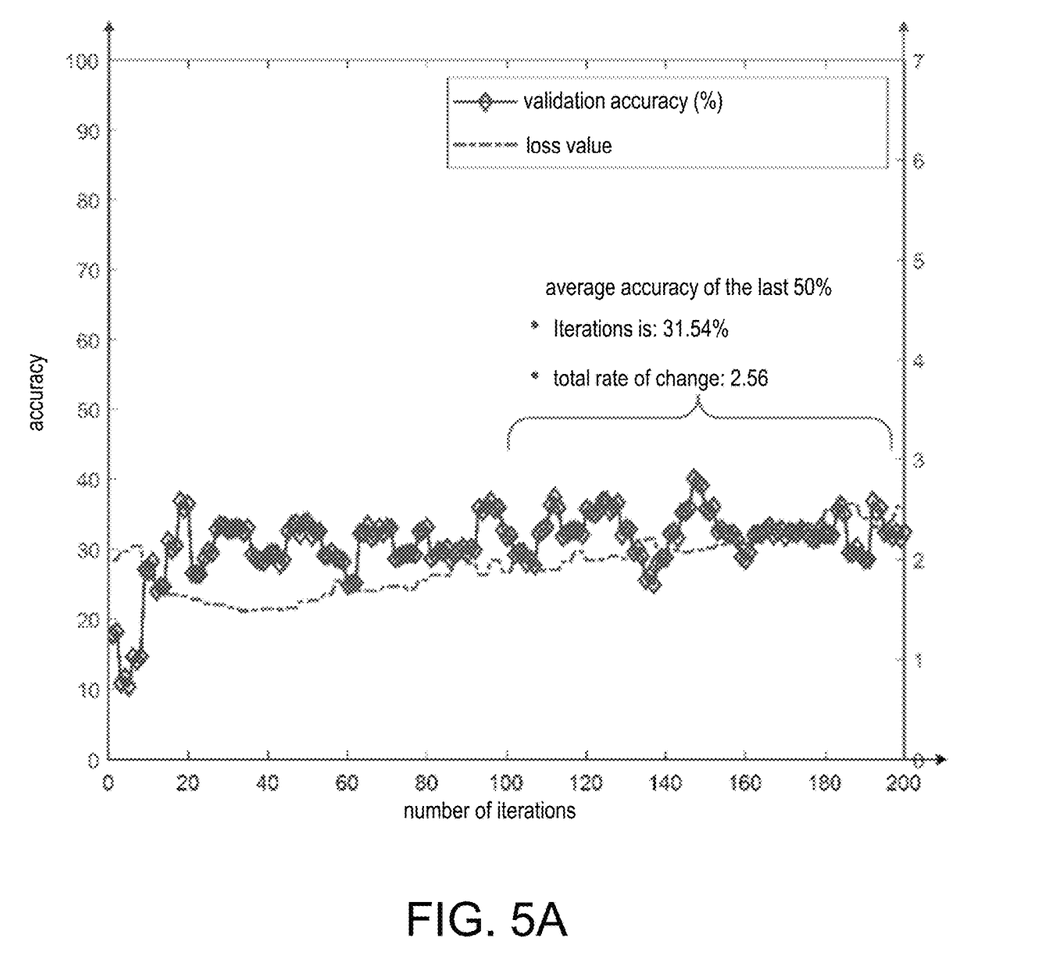
FIGS. 5A~5C is a validation effect of data set diagnosis based on a general convolutional network training method according to the disclosure.
Figure 5B:
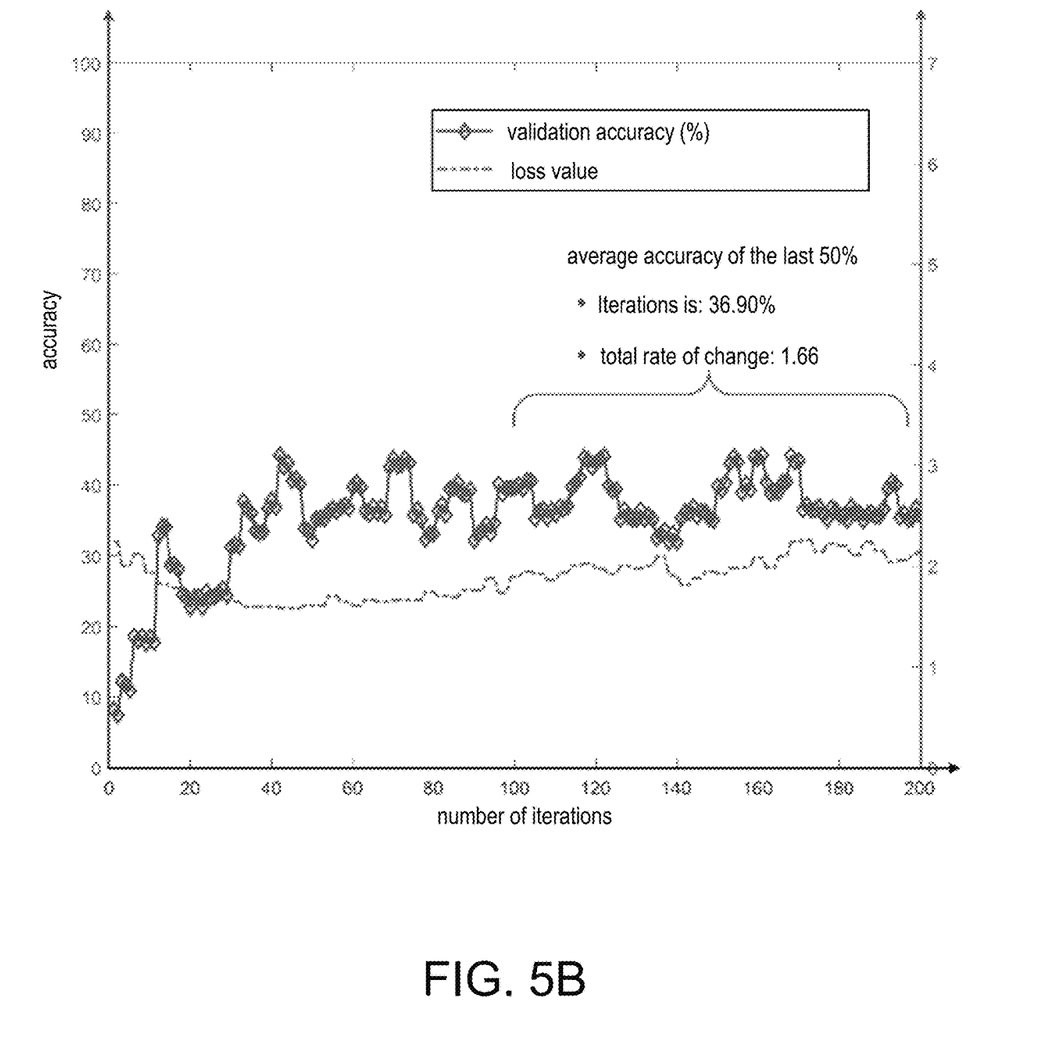
Figure 5C:
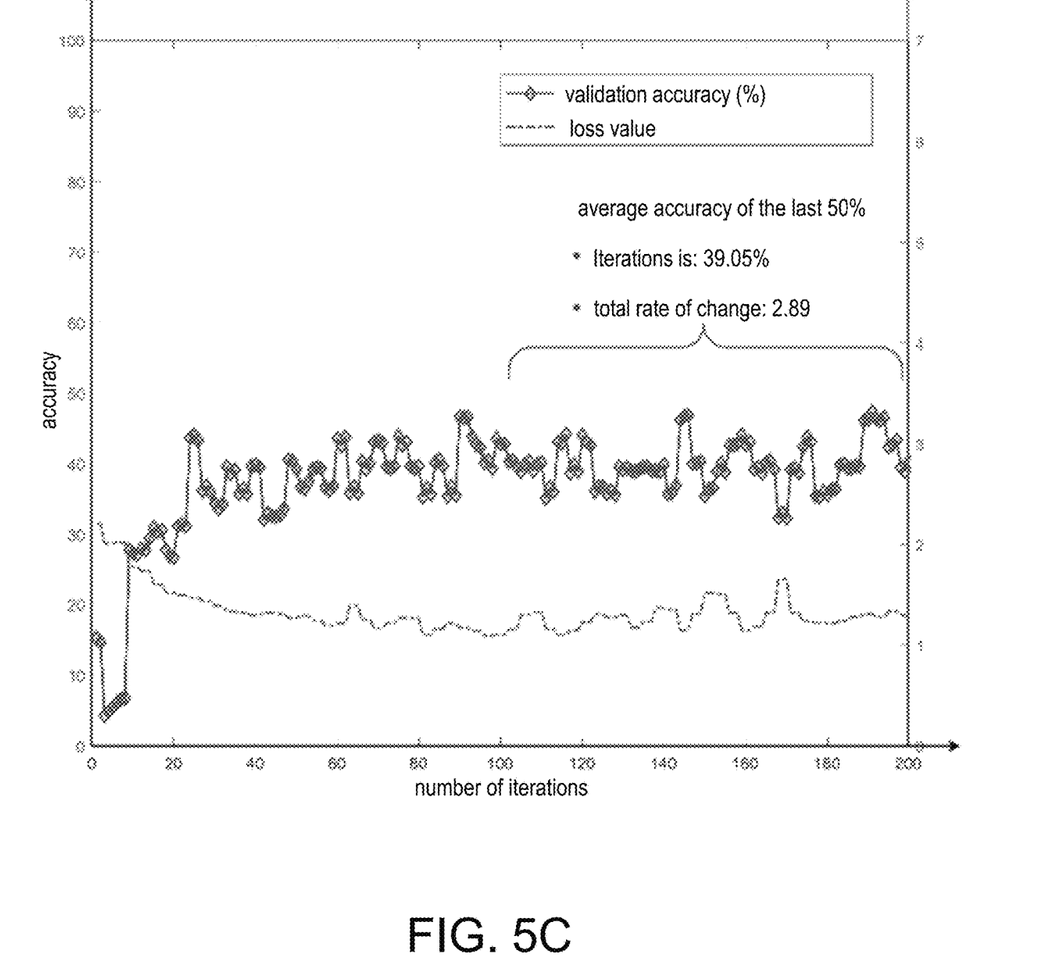

The data enhancement method may then be adopted to expand the data sets (including the simulation data set and the detection data set), so that overfitting may be prevented in the training process. Specific types and numbers of the data sets are shown in Table 1. In a transformer provided by this embodiment, the simulation data sets include 11,000 sets of data, and detection sample sets include 2,200 sets of data. 80% (8,800) of the simulation data sets are used for training, and 20% (2,200) are used for testing, a ration of the test set to the training set may be configured according to needs. 5% (110) of the detection data sets are used for training, and 95% (2,090) are used for testing. Transformer monitoring image data sets configured to train various types of convolutional neural networks (CNNs) are provided in Table 1. In can be seen that the number of the detection data sets is low, and only 110 detection data sets are used for training in this embodiment. Specific categories include: color conversion *6 (grayscale+5 RGB channels are randomly superimposed), rotating *3 (90°, 180°, and 270°), zooming *4 (0.8, 0.9, 1.1, and 1.2 times), mirror flipping *1, cropping *5, and randomly adding noise *5.

sis result obtained through the one-step transfer learning method, as shown in FIGS. 5A~5C, it can be seen that the two-stage transfer learning exhibits high accuracy and stability. The test data sets including the information of monitoring points are fused with the failure support matrix obtained through network diagnosis through a DS evidence theory. Information of different monitoring points are put into a same identification framework, and a basic probability assignment (BPA) thereof is calculated, the final probability assignment is finally synthesized, and normalization processing is performed. Since the transformer exhibits high reliability, only 5% of the detection data is adopted in this embodiment for training. If training is performed directly through a conventional transfer learning method and convolutional neural network, the diagnosis accuracy of each detection is 30.5%, 35.5%, and 39.5%, as shown in FIGS. 5A~5C. The diagnosis accuracy obtained through adopting the two-stage transfer learning is 67.3%, 56.0%, and 49.5%. Through fusion, the diagnosis accuracy may be increased from 79.6% to 89.5% through the method provided by this disclosure.

A three-stage transfer learning task is described in a second embodiment of the disclosure. When a considerable error is provided between the simulation result of the apparatus to be diagnosed and an actual test result, other apparatuses of the same model or a similar apparatus, remaining phases of a three-phase apparatus, etc. may also be used for transferring. Specific implementation steps are provided as follows. Bottom-layer network features are trained through the public data sets, and a trained general network model may be used as the model. The first-stage

TABLE 1

Data Sets for Two-Stage Transfer Learning Diagnosis

| Label | Simulation Data Set/Detection Data Set | Color Conversion | Rotating, Zooming, Mirror Flipping | Cropping | Adding Noise | Sum |
|---|---|---|---|---|---|---|
| 00 | 20/4 | 120/24 | 160/32 | 100/20 | 100/20 | 500/100 |
| 11/21/31 | 60/12 | 360/72 | 480/96 | 300/60 | 300/60 | 1500/300 |
| 12/22/32 | 60/12 | 360/72 | 480/96 | 300/60 | 300/60 | 1500/300 |
| 13/23/33 | 60/12 | 360/72 | 480/96 | 300/60 | 300/60 | 1500/300 |
| 14/24/34 | 60/12 | 360/72 | 480/96 | 300/60 | 300/60 | 1500/300 |
| 15/25/35 | 60/12 | 360/72 | 480/96 | 300/60 | 300/60 | 1500/300 |
| 16/26/36 | 60/12 | 360/72 | 480/96 | 300/60 | 300/60 | 1500/300 |
| 17/27/37 | 60/12 | 360/72 | 480/96 | 300/60 | 300/60 | 1500/300 |
| Totaling | 440/88 | 2640/528 | 3520/704 | 2200/440 | 2200/440 | 11000/2200 |

Note:
the data volume of different labels in the table is the same, so that the number of label "11/21/31" is three times that of the label "00".

The convolutional neural network of the two-stage transfer learning is built next, that is, a network is pre-trained through the public data sets, and bottom-layer features are acquired. The initial network training is performed on the simulation data sets by using the transfer learning method, specific features of the transformer to be tested are obtained, and the first-stage transfer learning process is completed. The detection data sets are used for refined training, and the second-stage transfer learning process is completed. The trained network is then used to perform a diagnosis on the transformer to be tested, and the transformer winding failure identification and location based on two-stage transfer is therefore accomplished.

Figure 4A:
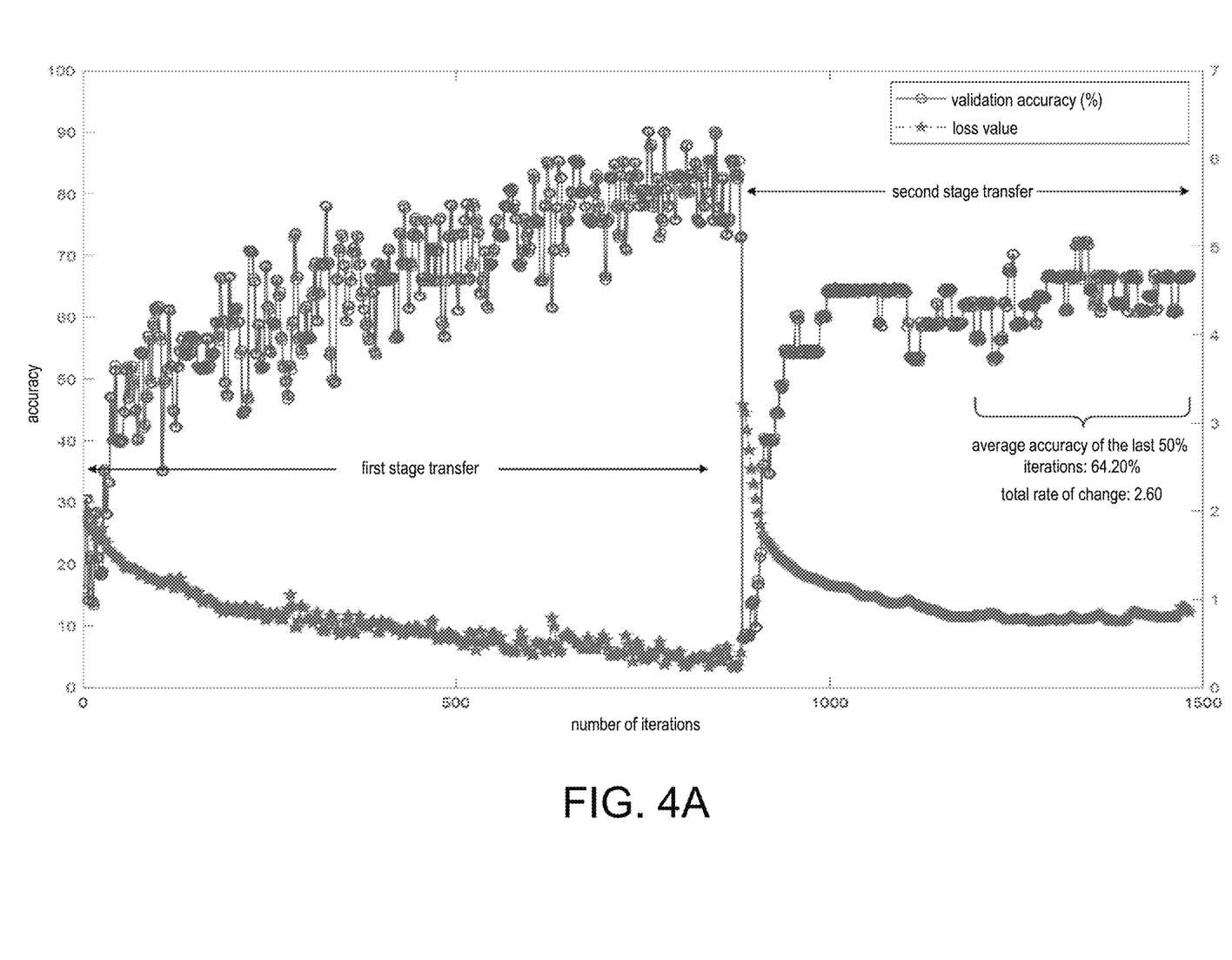
FIGS. 4A~4C is validation accuracy based on two-stage transfer diagnosis according to the disclosure.
Figure 4B:
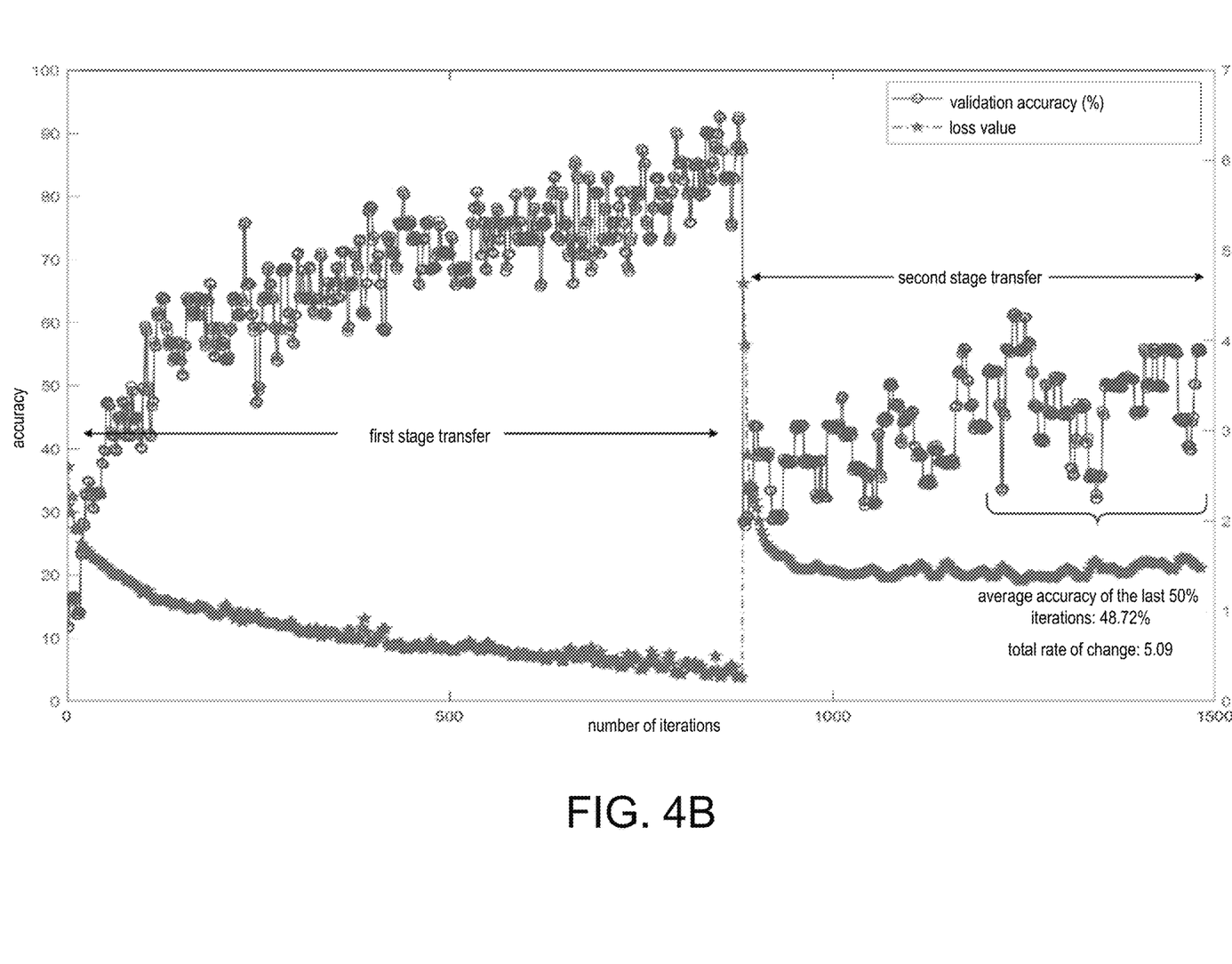
Figure 4C:
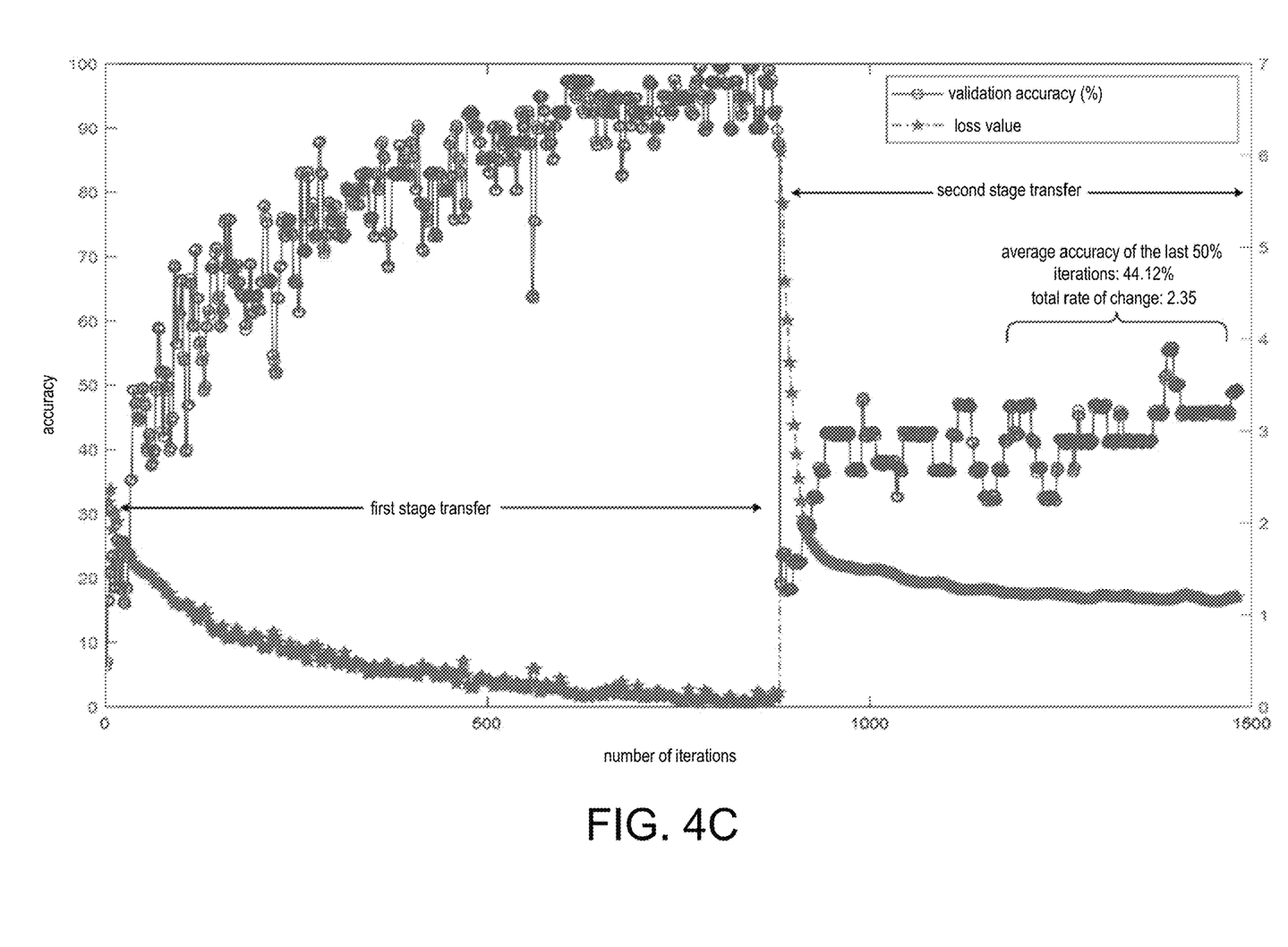

In this embodiment, validation accuracy of the detection data sets is equal to a diagnosis effect, and the validation accuracy in the training process is shown in FIGS. 4A~4C. When the validation accuracy is compared with the diagnotransfer is performed next, and part of the parameters of the trained network in the previous step are frozen. The simulation data sets of data to be diagnosed are obtained through computer simulation, and the simulation data sets are treated as a transfer target domain to train the network trained in the previous step. The second-step transfer process is performed next, and this process is similar to that provided in embodiment 1. First, part of the parameters of the network trained in the previous step are frozen. The similar apparatus of the apparatus to be diagnosed, other apparatuses of the same model (for the three-phase power apparatus), and detection information of the other two phases of the phase to be diagnosed as transition data sets for the second-step transfer training. Measured data sets of the apparatus to be diagnosed are finally used for third-step transfer training. Through the three-phase transfer learning process, the transfer process of sample data transferring from the public data sets, the simulation data sets, the similar apparatus data sets, to the apparatus to be diagnosed data is accomplished.

Further, according to needs and the multi-stage transfer learning model, transfer training of a 4th-stage, a 5th-stage, and a nth-stage may be performed. In the multi-stage transfer learning, a complete feature set satisfying the data to be diagnosed is formed through extraction of features of each step of the data sets, and all features are integrated based on a logic order from the bottom layer to the top layer through network training step by step. Through the multi-stage transfer learning, the features of the data to be diagnosed may be decomposed into feature modules. Different modules may belong to different levels or may belong to the same level. Multi-stage transfer training is performed based on the logic level from the bottom module level to the top module level through searching for data sets that include every module and may be easily obtained. The decomposition and fusion multi-stage transfer learning may be used to expand a sample search range. In this way, the problem of lack of data sets to be diagnosed which include all features is thereby solved. Specific implementation of the multi-stage transfer learning may satisfy the following requirements. 1) Completeness of the data set features is required to be satisfied. A sum of features contained in different data sets include all features of the data to be diagnosed. 2) A progressive relationship is provided among features of the data sets, and an order of learning is performed based on the logic order. Universal and low-level features are transited to specific and refined features, such as public image features (image texture features), apparatus features of the simulation data sets (principle mode of the apparatus to be diagnosed), and test features of the apparatus to be diagnosed (fine sample to be diagnosed) in embodiment 1 and public image features (image texture features), apparatus features of the simulation data sets (principle mode of the apparatus to be diagnosed), measurement features of a similar apparatus to be tested (similar fine test sample), and test features of the apparatus to be diagnosed (fine sample to be diagnosed) in embodiment 2. 3) Easy availability of the samples of the data sets after decomposition is required to be satisfied. A large number of representative and labeled samples are required to be obtained for network training. In the case of the multi-stage transfer learning, the data sets are marked as $D\xi$, where $\xi$ represents different data sets ($\xi \geq 3$). Transferring is performed based on the following formula:

$$\begin{cases} D_{s\xi} = \{\chi_\xi, P_\xi(x_\xi)\}; \\ T_\xi = \{Y_\xi, f_\xi(\cdot)\}; \\ \xi = \{1, 2, \ldots\}; \end{cases}$$

where $$X_\xi = \{\chi_{\xi 1}, \chi_{\xi 2}, \ldots, \chi_{\xi n}\} \in X_\xi;$$

$$Y_\xi = \{y_{\xi 1}, \ldots, y_{\xi n 2}\};$$

The disclosure further provides a computer storage media storing a computer program which may be executed by a processor. The computer program executes the transformer failure identification and location diagnosis method based on two-stage transfer learning. Further, the special case of two-stage transfer learning is applied, and powerful image feature extraction capabilities provided by a convolutional neural network (CNN) are introduced into the field of transformer failure diagnosis which lacks data. Through a progressive relationship among public data, simulation data, and a small amount of experimental data, network training of deep learning is completed. High diagnosis accuracy is thereby achieved through training of a small amount of data sets.

Favorable effects produced by the disclosure includes full mining of power equipment simulation data information through multi-stage transfer learning, a decrease in the needs for equipment test sets, and full use of power equipment simulation data. Diagnosis accuracy is improved in the case of a small amount of data.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A transformer failure identification and location diagnosis method based on multi-stage transfer learning, comprising:
   1) Establishing a finite element model according to a structure and a material property of a transformer to be tested and simulating and calculating a winding parameter of transformer;
   2) Performing a sweep frequency response test on the transformer to be tested and simulating different failure situations of the transformer; wherein a plurality of taps are selected to act as detection points of the sweep frequency response test if the taps are present and obtaining detection data sets comprising information of the detection points, and history detection data of the transformer to be tested is added to the detection data sets if the history detection data is provided;
   3) Building a winding equivalent circuit of the transformer, inputting the winding parameter obtained through calculating into the equivalent circuit, and performing programming to accomplish a sweep frequency response analysis of the equivalent circuit;
   4) Setting up a loop in a program and simulating and obtaining a large number of simulation data sets for the detection points and failure situations in 2);
   5) Constructing a convolutional neural network of multi-stage transfer learning, dividing each of the simulation data sets and the detection data sets into a training set and a validation set, and performing data enhancement on all data;
   6) Performing initial network training on the simulation data sets by using a transfer learning method;
   7) Keeping a one-stage trained network and accordingly performing multi-stage training on the detection data sets; and
   8) Diagnosing the transformer to be tested by using the trained network and finally fusing the detection data sets comprising the information of the detection points with a failure support matrix obtained through network diagnosis,
   wherein the step of simulating different failure situations in step 2) further comprises: adding a pad between different windings or between a winding and an iron core and simulating a winding pitch failure and a winding ground failure; connecting the taps to a resistor, a capacitor, or an inductor in parallel to simulate a failure if the taps are present; and selecting the taps to act as the detection points of the sweep frequency response test when the taps are present and obtaining the detection data sets comprising the information of the detection points.

2. The transformer failure identification and location diagnosis method based on multi-stage transfer learning according to claim 1, wherein the structure of the transformer provided in step 1) comprises an axial height, a winding thickness, a winding radial width, an iron core thickness, an iron core outer diameter, a winding inner diameter, an insulation paper outer diameter, an end ring thickness, a pad thickness, and a stay thickness of the transformer to be tested, the material property of the transformer comprises relative dielectric constants of insulation paper, a pad, a stay, an end ring, and a phenolic paper tube, simulating and obtaining the parameter of the transformer are performed for a normal state, resistance and self-inductance are calculated by using 1 disk in a 3D model, mutual inductance and capacitance are calculated by using 2 disks, earth capacity Cg is calculated by using an iron core and one disk of winding, 2nd-order mutual inductance is calculated by using 3 disks of winding, and winding parameters of orders in an approximate equivalent circuit are identical in the equivalent circuit.

3. The transformer failure identification and location diagnosis method based on multi-stage transfer learning according to claim 1, wherein the winding equivalent circuit of the transformer in step 3) is an N-order lumped parameter equivalent circuit, circuit parameters: ground resistance Cg, inter-winding capacitance Cs, self-inductance Ls, mutual inductance Mi(i+1), and resistance R calculated and obtained in step 1) are substituted into the equivalent circuit, and the sweep frequency response analysis is accomplished through programming.

4. The transformer failure identification and location diagnosis method based on multi-stage transfer learning according to claim 1, wherein the step of obtaining the simulation data sets in step 4) further comprises: setting up a loop based on a normal state value and selecting parameters of ground resistance Cg, inter-winding capacitance Cs, self-inductance Ls, mutual inductance Mi(i+1), and resistance R of the equivalent circuit provided to be 1-2 times the normal state value according to detection content, wherein selection of a loop step length and an abnormal parameter is determined according to a required number of the data sets and a failure type needed to be detected.

5. The transformer failure identification and location diagnosis method based on multi-stage transfer learning according to claim 1, wherein the step of constructing the convolutional neural network based on multi-stage transfer learning for performing two-stage transfer learning in step 5) specifically comprises:

1) Marking public data sets as $D_1$, the simulation data sets as $D_2$, and detection data as $D_3$, such that first-stage transfer learning comprises:

$$\text{Source:} \begin{cases} D_s = D_1 = \{\chi_1, P_1(X_1)\}; \\ T_s = T_1 = \{Y_1, f_1(\cdot)\}; \end{cases}$$

$$\text{Target:} \begin{cases} D_T = D_2 = \{\chi_2, P_2(X_2)\}; \\ T_T = T_2 = \{Y_2, f_2(\cdot)\}; \end{cases}$$

$$X_\xi = \{\chi_{\xi 1}, \chi_{\xi 2}, \ldots, \chi_{\xi n1}\} \in \chi_\xi |_{\xi=1,2};$$

$$Y_\xi = \{y_{\xi 1}, \ldots, y_{\xi n2}\} |_{\xi=1,2};$$

wherein a source domain $D_S$, a learning task $T_S$ on the source domain, a target domain $D_T$, and a learning task $T_T$ on the target domain are provided, wherein $D_S/D_T$, $T_S/T_T$, $\chi$ represents a feature space, $P(X)$ represents a marginal probability distribution, $X=\{x_1, \ldots, X_{n1}\} \in \chi$, $Y$ represents a label space, $Y=\{y_1, \ldots, y_{n2}\}$, n1 represents a feature space size, n2 represents a label space size, n1=n2=n, a prediction function $f(\cdot)$ may not be observed, a domain and a label are required to be learned in pairs, $D_1 \gg D_2$, $D_1$ is not similar to $D_2$, the first-stage transfer learning is transferred from $D_1$ to $D_2$, part of convolutional layers close to an input end of a pre-training model are frozen, and the remaining convolutional layers close to an output end and a full connection layer are trained, 2) A second-stage transfer process comprises the following:

$$\text{Source:} \begin{cases} D_s = D_{1 \cup 2} = \{\chi_{1 \cup 2}, P_{1 \cup 2}(X_1, X_2)\}; \\ T_s = T_{1 \cup 2} = \{Y_{1 \cup 2}, f_{1 \cup 2}(\cdot)\}; \end{cases}$$

$$\text{Target:} \begin{cases} D_T = D_3 = \{\chi_3, P_3(X_3)\}; \\ T_T = T_3 = \{Y_3, f_3(\cdot)\}; \end{cases}$$

$$X_\xi = \{\chi_{\xi 1}, \chi_{\xi 2}, \ldots, \chi_{\xi n1}\} \in \chi_\xi |_{\xi=1 \cup 2,3};$$

$$Y_\xi = \{y_{\xi 1}, \ldots, y_{\xi n2}\} |_{\xi=1 \cup 2,3};$$

wherein a subscript $\xi = $ "$1 \cup 2$" represents a new domain/task/feature space/label space/probability distribution/prediction function after a first transfer, where $D_{1 \cup 2} > D_3$ and $D_{1 \cup 2} \sim D_3$, second-stage transfer learning is transferred from $D_{1 \cup 2}$ to $D_3$, most of the convolutional layers of a network model obtained through the previous step of transfer are frozen, and the remaining convolutional layers and the full connection layer are trained.

6. The transformer failure identification and location diagnosis method based on multi-stage transfer learning according to claim 1, wherein the step of performing data enhancement to expand the data sets in step 5) comprises following categories to be specifically processed: color conversion *6 times, randomly adding noise *5 times, zooming *4 times, flipping *1 times, rotating *3 times, and cropping *5 times.

7. The transformer failure identification and location diagnosis method based on multi-stage transfer learning according to claim 1, wherein the steps of dividing each of the simulation data sets and the detection data sets into a test set and the validation set in a network training process in steps 6) to 7) further comprise: performing training validation on a first-stage transfer process and a second-stage transfer process sequentially inputted into a two-stage convolutional neural network; determining a dividing ratio of the test set to the validation set according to actual needs; inputting the test set and the validation set of the simulation data sets in the first stage and inputting the test set and the validation set of the detection data sets in the second stage; and progressively updating network parameters and finally obtaining a trained network diagnosis model.

8. The transformer failure identification and location diagnosis method based on multi-stage transfer learning according to claim 1, wherein the method of fusing diagnosis information of the detection points in step 8) comprises a multi-source information fusion algorithm of evidence theory to synthesize diagnosis results of the detection points.

9. The transformer failure identification and location diagnosis method based on multi-stage transfer learning according to claim 2 is implemented by a non-transitory-computer storage media, storing a computer program executed by a processor.

10. The transformer failure identification and location diagnosis method based on multi-stage transfer learning according to claim 1 is implemented by a non-transitory computer storage media, storing a computer program executed by a processor.

11. The transformer failure identification and location diagnosis method based on multi-stage transfer learning according to claim 3 is implemented by a non-transitory computer storage media, storing a computer program executed by a processor.

12. The transformer failure identification and location diagnosis method based on multi-stage transfer learning according to claim 4 is implemented by a non-transitory computer storage media, storing a computer program executed by a processor.

13. The transformer failure identification and location diagnosis method based on multi-stage transfer learning according to claim 5 is implemented by a non-transitory computer storage media, storing a computer program executed by a processor.

14. The transformer failure identification and location diagnosis method based on multi-stage transfer learning according to claim 6 is implemented by a non-transitory computer storage media, storing a computer program executed by a processor.

15. The transformer failure identification and location diagnosis method based on multi-stage transfer learning according to claim 7 is implemented by a non-transitory computer storage media, storing a computer program executed by a processor.

\* \* \* \* \*